(12) United States Patent
Singnurkar (10) Patent No.: US 9,304,644 B2
(45) Date of Patent: Apr. 5, 2016

(54) TOUCH SENSING SYSTEM AND METHOD FOR OPERATING A TOUCH SENSING SYSTEM

(71) Applicant: ams AG, Unterpremstätten (AT)

(72) Inventor: Pramod Singnurkar, Graz (AT)

(73) Assignee: ams AG, Unterpremstätten (AT)

( * ) Notice: Subject to any disclaimer, the term of this patent is extended or adjusted under 35 U.S.C. 154(b) by 40 days.

(21) Appl. No.: 14/354,119

(22) PCT Filed: Oct. 5, 2012

(86) PCT No.: PCT/EP2012/069786
§ 371 (c)(1),
(2) Date: Apr. 24, 2014

(87) PCT Pub. No.: WO2013/060565
PCT Pub. Date: May 2, 2013

(65) Prior Publication Data
US 2014/0368464 A1 Dec. 18, 2014

(30) Foreign Application Priority Data

Oct. 25, 2011 (EP) .................................... 11186563

(51) Int. Cl.
*G06F 3/044* (2006.01)
*G06F 3/041* (2006.01)
*H03K 17/96* (2006.01)

(52) U.S. Cl.
CPC .............. *G06F 3/044* (2013.01); *G06F 3/0418* (2013.01); *H03K 17/962* (2013.01); *H03K 2217/960775* (2013.01)

(58) Field of Classification Search
None
See application file for complete search history.

(56) References Cited

U.S. PATENT DOCUMENTS

2005/0088416 A1* 4/2005 Hollingsworth .............. 345/173
2008/0265914 A1 10/2008 Matsushima
(Continued)

OTHER PUBLICATIONS

Atmel, John Carey, "Getting in touch with capacitance sensor algorithms", www.eetimes.com/General/PrintView/4008781, from Jun 20, 2012, pp. 1-7.

*Primary Examiner* — Kent Chang
*Assistant Examiner* — Nathan Brittingham
(74) *Attorney, Agent, or Firm* — McDermott Will & Emery LLP (57) ABSTRACT

A touch sensing system comprises a signal generator (Tx), which is configured to provide an AC signal, a signal receiver (Rx), which is configured to perform a signal detection, a first transmitter node (T1), which is connected to the signal generator (Tx) in a switchable fashion, a second transmitter node (T2), which is connected to the first transmitter node (T1) in a switchable fashion and to a reference potential terminal (GND) in a switchable fashion, a first receiver node (R1), which is connected to the signal receiver (Rx) in a switchable fashion and to the first transmitter node (T1) in a switchable fashion, a second receiver node (R2), which is connected to the first receiver node (R1) in a switchable fashion and to the reference potential terminal (GND) in a switchable fashion, a first electrode (E1), which is connected to the second transmitter node (T2) in a switchable fashion, a second electrode (E2), which is connected to the second receiver node (R2) in a switchable fashion, and a capacitance measurement circuit (CMC). The capacitance measurement circuit (CMC) is coupled to the first transmitter node (T1) and/or the second transmitter node (T2), coupled to the first receiver node (R1) and/or the second receiver node (R2), and configured to measure respective capacitance values at the first transmitter node (T1) or the second transmitter node (T2) and at the first receiver node (R1) or the second receiver node (R2).

17 Claims, 6 Drawing Sheets

(56) References Cited

U.S. PATENT DOCUMENTS

2010/0060608 A1* 3/2010 Yousefpor .................... 345/174
2010/0164479 A1* 7/2010 Alameh et al. ............... 324/115
2010/0328257 A1* 12/2010 Noguchi et al. .............. 345/174
2011/0043478 A1* 2/2011 Matsushima ................. 345/174
2013/0285973 A1* 10/2013 Elias et al. ................... 345/174

* cited by examiner

TOUCH SENSING SYSTEM AND METHOD FOR OPERATING A TOUCH SENSING SYSTEM

The invention relates to a touch sensing system, to a method for operating a touch sensing system and to a mobile device with a touch sensing system.

In the field of detecting proximity of objects, like human fingers, to devices, for instance portable systems, mobile phones, cordless phones, PDAs, different solutions based on capacitive sensing are employed. An example solution uses two electrodes that constitute a specific capacitance, which changes, when an object like a human finger is in proximity of the two electrodes. During operation of a touch sensing system with such two electrodes, a signal is provided to a first one of the electrodes and a resulting signal is measured at the second one of the two electrodes. With a change in capacitance, for example an amplitude of the received signal changes, indicating a possible proximity of the object.

However, the capacitance value between the two electrodes usually is not static, even if no object is in proximity of the electrodes, but changes with various environmental factors like e.g. humidity. Hence, it is desirable to perform a calibration of the touch sensing system with the two electrodes in order to have a defined value with no object being in proximity of the electrodes. In conventional touch sensing systems, such a calibration can only be performed, if no object is present or in proximity at the two electrodes.

It is an object of the present invention to provide an improved concept for calibrating a touch sensing system with two electrodes.

This object is achieved with the subject matter of the independent claims. Embodiments and developments of the invention are subject matter of the dependent claims.

For example, a touch sensing system is provided such or operated such that a calibration can be performed both with no sense object present and a sense object being present. Herein, the term present is used for a sense object being in proximity to the two electrodes, in particular in proximity to both electrodes at a time. To this end, the touch sensing system is able to perform a measurement of capacitance at the electrodes or nodes connected to the electrodes respectively such that the influence of a sense object being present can be calculated out, if necessary. For example, a calculation of measured values can be made dependent on whether a sense object is detected to be present at the electrodes or not. Furthermore, capacitance measurements can be used to detect, whether a sense object is present, or to verify such detection.

For example, an embodiment of a touch sensing system comprises a signal generator, which is configured to provide an AC signal, and a signal receiver, which is configured to perform a signal detection. The touch sensing system comprises a first transmitter node, which is connected to the signal generator in a switchable fashion, a second transmitter node, which is connected to the first transmitter node in a switchable fashion and to a reference potential terminal in a switchable fashion. Furthermore, the touch sensing system comprises a first receiver node, which is connected to the signal receiver in a switchable fashion and to the first transmitter node in a switchable fashion, and a second receiver node, which is connected to the first receiver node in a switchable fashion and to the reference potential terminal in a switchable fashion. A first electrode is connected, in particular directly connected, to the second transmitter node, and a second electrode is connected, in particular directly connected, to the second receiver node. The touch sensing system comprises a capacitance measurement circuit, which is coupled to the first transmitter node and/or to the second transmitter node, is coupled to the first receiver node and/or to the second receiver node, and is configured to measure respective capacitance values at the first transmitter node or the second transmitter node and at the first receiver node or the second receiver node.

Hence, with the signal generator and the signal receiver a transmission of the AC signal from the first electrode to the second electrode can be evaluated in order to detect a change in capacitance and therefore the presence of a sense object at the first and the second electrode. To this end, the respective switchable connections between the transmitter and the first electrode and between the receiver and the second electrode, respectively are closed. By means of the capacitance measurement circuit, capacitance values at both the receiver side and the transmitter side can be measured by closing respective switchable connections and leaving open such connections, which are not needed for measurement. Furthermore, by electrically connecting the first receiver node and the first transmitter node, the first and the second electrode can be shortened or at least be brought to basically the same potential. Hence, if a capacitance measurement is performed in this configuration, an influence of a sense object in proximity to the first and the second electrode is eliminated. As a consequence, a capacitance value measured in this configuration can be used to perform a calibration regardless whether the sense object is present or not.

For example, the touch sensing system is configured to detect, whether a sense object is present at the first electrode and the second electrode, based on the signal detection of the signal receiver in response to an AC signal provided by the signal generator. The information about the presence of the sense object may be used for calibration purposes. Such detection can be called a transmitter/receiver detection.

According to various embodiments, the touch sensing system is configured to measure, in a first measuring period, a first capacitance value at at least one of the first transmitter node, the second transmitter node, the first receiver node and the second receiver node, with the respective node being electrically connected to both the first electrode and the second electrode. Furthermore, the touch sensing system is configured to measure, in a second measuring period, a second capacitance value at at least one of the first receiver node and the second receiver node, with the respective node being electrically connected to the second electrode and with the first electrode being electrically connected to the reference potential terminal. The touch sensing system is further configured to measure, in a third measuring period, a third capacitance value at at least one of the first transmitter node and the second transmitter node, with the respective node being electrically connected to the first electrode, and with the second electrode being electrically connected to the reference potential terminal.

Accordingly, the first capacitance value is a common or total capacitance value, which includes the capacitance between the commonly connected electrodes and the reference potential terminal, e.g. ground. The second capacitance value corresponds to capacitance of the second electrodes with the reference potential terminal. In a similar fashion, the third capacitance value corresponds to the capacitance of the first electrode to the reference potential terminal. A calculation of calibrated reference capacitance values can be performed based on these measurements and the knowledge or assumption, whether a sense object is present at the electrodes.

For example, if a sense object was detected to be present by means of the transmitter/receiver detection, a total capacitance value is determined on the basis of the first capacitance value, and a stored total reference value is updated with the total capacitance value. A receiver capacitance value is determined on the basis of the first capacitance value, the second capacitance value and the third capacitance value, and a stored receiver reference value is updated with the receiver capacitance value. In a similar fashion, a transmitter capacitance value is determined on the basis of the first capacitance value, the second capacitance value and the third capacitance value, and the stored transmitter reference value is updated with the determined transmitter capacitance value.

Hence, the influence of the sense object being present is calculated out during determination of the receiver capacitance value or the receiver reference value, respectively and for the determination of the transmitter capacitance value or the transmitter reference value, respectively. Due to the common connection of the first and the second electrode during measurement of the first capacitance value, an influence of the presence of the sense object is eliminated, such that the total capacitance value may be directly used for updating the total reference value.

For example, the touch sensing system is configured, if a sense object was detected to be present, to take the first capacitance value as the total capacitance value, to calculate the receiver capacitance value according to $$(Crm-Ctm+Ctot)/2,$$

to calculate the transmitter capacitance value according to $$(Ctm-Crm+Ctot)/2,$$

wherein Ctot is the first capacitance value, Crm is the second capacitance value and Ctm is the third capacitance value.

The reference values can be used for calibration in a following detection cycle employing a transmitter/receiver detection. It is desirable that the measuring of the capacitance values, during the first, the second and the third measuring period immediately or basically immediately follow the transmitter/receiver detection.

Hence, the described touch sensing system makes it possible to perform a calibration even if a sense object is present at the electrodes of the touch sensing system.

If a sense object was not detected to be present by the transmitter/receiver detection, this can have two causes. First, a sense object is indeed not present at the first and the second electrode, and, second, a sense object is present at the first and the second electrode but connected to the same reference potential terminal as the touch sensing system itself. This second constellation cannot be detected by the transmitter/receiver detection. However, the capacitance values measured during the first, the second and the third measuring period can be used to determine, whether a sense object is present, for example.

Accordingly, the touch sensing system may be configured, if a sense object was not detected to be present, to perform a comparison of at least one of the following: the first capacitance value with the stored total reference value, a second capacitance value with the stored receiver reference value and the third capacitance value with the stored transmitter reference value. For example, the comparison of the respective capacitance values comprises to determine, whether the difference between the respective capacitance values exceeds a respective threshold. On the basis of the comparison, it can be determined whether a sense object is present. Accordingly, if a sense object is determined not to be present, the touch sensing system is configured to update the total reference value with the first capacitance value, to update the receiver reference value with the second capacitance value and to update the transmitter reference value with the third capacitance value.

Accordingly, if a sense object is determined to be present based on the comparison with one or more of the stored reference values, no calibration or updating of the stored reference values is performed. However, the capacitance measurement is not only used for calibrating the touch sensing system but also for a detection of a sense object being present at the first and the second electrodes.

It may be sufficient to measure each of the first, second and third capacitance value at only one of the respective nodes. However, it may be desirable to increase the significance of the measurements by performing capacitance measurements at more than one respective node, if these nodes are connected by a switch, for example. To have a single capacitance value for further processing, an averaging can be performed over the number of capacitance measurements. In particular, if a respective capacitance value is measured at more than one respective node, the touch sensing system may be configured to perform averaging over the respective measured capacitance values. This may in particular be desirable for measurement of the first capacitance value corresponding to the total capacitance of both the first and the second electrode.

According to various embodiments, the capacitance measurement circuit is configured to measure a respective capacitance value by providing a reference current to the respective node, at which the capacitance value is to be measured, measuring a voltage at the respective node, determining a time period, during which the measured voltage changes from a first predefined value to a second predefined value, and determining the respective capacitance value on the basis of the determined time period. In particular, the capacitance value may be expressed by a counter value resulting from the determination of the time period. Alternatively, such a counter value or the determined time period, respectively, can be used to map the capacitance value to a different domain.

A touch sensing system according to one of the embodiments described above can be implemented in a mobile device like a mobile phone or a touchpad or the like. For example, the mobile device has a housing and the first electrode and the second electrode are arranged in or on the housing. For example, the first and the second electrode are arranged spaced apart on one side of the housing, such that presence of a sense object can be constituted by a human hand gripping the housing or the first and the second electrode, respectively, with two fingers. In other implementations, the first and the second electrode may be located on different sides of the housing, such that the presence of a sense object may be constituted by gripping the housing of the mobile device at both sides of the housing, e.g. between thumb and another finger of a human hand.

In an embodiment of a method for operating a touch sensing system, the touch sensing system comprises a first transmitter node, a second transmitter node, a first receiver node, a second receiver node, a first electrode and a second electrode. In a first measuring period, a first capacitance value is measured at at least one of the first transmitter node, the second transmitter node, the first receiver node and the second receiver node, with the respective node being electrically connected to both the first electrode and the second electrode. In a second measuring period, a second capacitance value is measured at at least one of the first receiver node and the second receiver node, with the respective node being electrically connected to the second electrode and with the first electrode being electrically connected to a reference potential terminal. In a third measuring period, a third capacitance value is measured at at least one of the first transmitter node and the second transmitter node, with the respective node being electrically connected to the first electrode and with the second electrode being electrically connected to the reference potential terminal.

As described above for various embodiments of the touch sensing system, the three measurements of the capacitance values make it possible to perform a calibration even if a sense object is present at the first and the second electrode.

In one embodiment of the method, an AC signal is provided to the first electrode, and a signal is measured at the second electrode in response to the AC signal provided to the first electrode. Based on the measured signal, it is detected, whether a sense object is present at the first electrode and the second electrode. This information about the presence of the sense object can be used for respective evaluation of the measured capacitance values in order to perform a calibration of the touch sensing system, as described above for the various embodiments of the touch sensing system.

Further embodiments of the method for operating the touch sensing system become apparent from the various embodiments of the touch sensing system described above.

The text below explains the invention in detail using exemplary embodiments with reference to the drawings. Components and circuit elements that are functionally identical or have the identical effect bear identical reference numbers. In so far as circuit parts or components correspond to one or another function, description of them will not be repeated in each of the following Figures.

Figure 1:
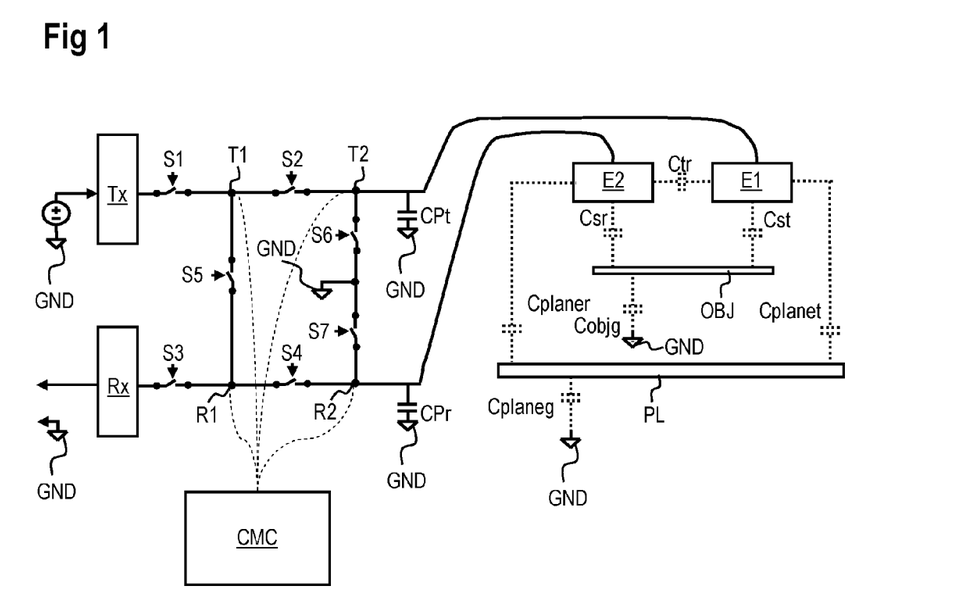
FIG. 1 shows an embodiment of a touch sensing system in conjunction with a sense object.

FIG. 1 shows a block diagram of an embodiment of a touch sensing system and possible capacitances during operation of the touch sensing system. The touch sensing system comprises a signal generator Tx which is supplied by a power source like a voltage source. The signal generator Tx is configured to provide an AC signal at its output. The touch sensing system further includes a signal receiver Rx, which is configured to perform a signal detection of a signal at its input. The touch sensing system includes a first transmitter node T1, a second transmitter node T2, a first receiver node R1 and a second receiver node R2. The first transmitter node T1 is connected to the output of the signal generator Tx by a switch S1, and to the second transmitter node T2 by a switch S2. In a similar fashion, the first receiver node R1 is connected to the input of the signal receiver Rx by a third switch S3 and to the second receiver node R2 by a fourth switch S4. The first transmitter node T1 and the first receiver node R1 are connected by a fifth switch S5. Each of the second transmitter node T2 and the second receiver node R2 are connected to a reference potential terminal GND by respective switches S6 and S7. The touch sensing system includes a first electrode or transmitter electrode E1 and a second electrode or receiver electrode E2, wherein the first electrode E1 is directly connected to the second transmitter node T2 and the second electrode E2 is directly connected to the second receiver node R2.

The touch sensing system further includes a capacitance measurement circuit CMC, which is coupled to the first and the second transmitter node T1, T2 and the first and the second receiver node R1, R2. The capacitance measurement circuit is configured to measure respective capacitance values at the respective nodes T1, T2, R1, R2, to which it is connected. In various implementation forms, some of the connections of the capacitance measurement circuit CMC to the respective nodes can be omitted, such that for example the capacitance measurement circuit CMC is only connected to the first transmitter node T1 and to the first receiver node R1. However, the capacitance measurement circuit is at least connected to one of the transmitter nodes T1, T2 and to one of the receiver nodes R1, R2.

In the block diagram of FIG. 1, furthermore pad capacitances CPt and CPr are shown, which stand for a total parasitic capacitance including electrode capacitances to the reference potential terminal GND or ground, electrostatic discharge, ESD, capacitances and any further parasitic capacitances from the second transmitter node T2 to ground for CPt and from the second receiver node R2 to ground for CPr. In particular, the capacitances CPt, CPr are not realized by any distinct capacitor device but purely result from the arrangement of the touch sensing system with the electrodes E1, E2.

FIG. 1 further shows a sense object OBJ and a plane PL, e.g. a table, in particular a metal table, a laptop, a shelf or another object which is in the vicinity of the touch sensing system but has no direct connection to a common ground, namely the reference potential terminal GND of the touch sensing system. From the arrangement of the electrodes E1, E2, the sense object OBJ and the plane PL further capacitances result, becoming effective at the different elements, which will be explained in the following. For example, the capacitance Ctr denotes an inter-electrode capacitance between the first and the second electrode E1, E2, which would be very small in case the electrodes E1, E2 are physically spaced apart. Furthermore, respective capacitances Csr, Cst result between the electrodes E1, E2 and the sense object OBJ, wherein the values of the capacitances Csr, Cst increase with the sense object OBJ getting closer to the electrodes E1, E2. In particular, the change of capacitance value of the capacitances Csr, Cst can be used to detect, whether the sense object OBJ is present at the first and the second electrode E1, E2, that means is in close proximity to the electrodes E1, E2.

Further capacitances result as the capacitance Cobjg between the sense object OBJ and the reference potential terminal GND, as capacitances Cplaner, Cplanet between the first and the second electrode E1, E2 and the plane PL, and as Cplaneg between the plane and the reference potential terminal GND. For example, the capacitances Cplaner, Cplanet result from the electrodes E1, E2 making a capacitance to the plane PL which extends from the transmitter electrode E1 to the receiver electrode E2. It may be desirable keep the capacitances Cplaner, Cplanet very small compared to a minimum capacitance to be sensed, in particular the capacitances Csr, Cst. The capacitances Cplaneg and Cobjg usually are not controllable and may have a value between 0 and a few hundred picofarads.

As mentioned before, the presence of the sense object OBJ at the electrodes E1, E2 can be detected due to a change of the capacitances Csr, Cst, which results in a change of capacitance at the transmitter node T1, T2 and the receiver node R1, R2. However, the capacitance values of the other capacitances like CPt, CPr, Ctr, Cplaner, Cplaner, Cplanet, Cobjg, Cplaneg should be known with a certain accuracy to increase the probability that a sensed change in capacitance really results from a change in Csr, Cst. Hence, a calibration of the touch sensing system is desirable, which will be explained later in more detail.

One first method to detect a change of the capacitances Csr, Cst is a frequency measurement, during which an AC signal is transmitted from the signal generator Tx to the signal receiver Rx via the electrodes E1, E2. As a signal is transmitted from the first electrode E1 to the second electrode E2, such a method can also be called a transmission method.

If no sense object is present at the first and the second electrode E1, E2, a received value at the signal receiver Rx is at a first level, which is known, if the touch sensing system is calibrated and the respective capacitances are known. For example, a signal received at the signal receiver Rx is digitized by an analogue to digital converter to have a digitized reception value at the first level.

If a sense object is present at the electrodes E1, E2, the capacitances Csr, Cst increase such that the resulting received value at the signal receiver Rx also increases due to the better coupling between the electrodes E1, E2. The presence of the sense object can be detected or determined if the received value is at or above a second level or, in particular, if a difference to the known first level exceeds a predefined threshold.

For the above described transmission method, switches S1, S2, S3 and S4 are closed, whereas switches S5, S6, S7 are open, in order to connect the first electrode E1 to the output of the signal generator Tx and the second electrode E2 to the signal receiver Rx.

Figure 2:
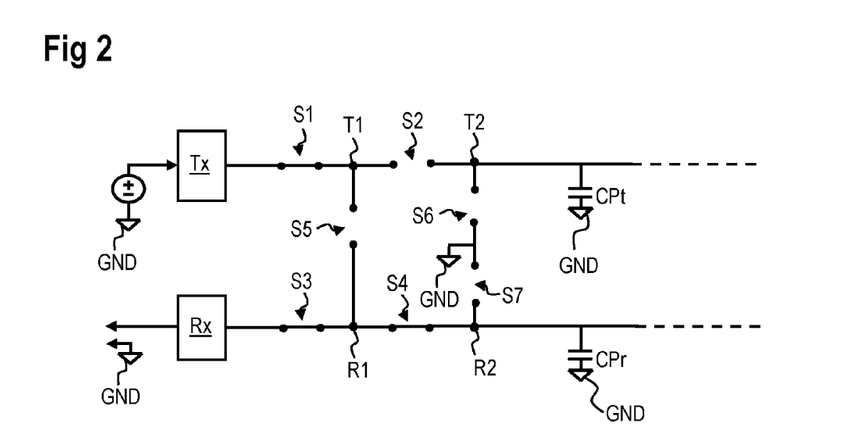
FIG. 2 shows an exemplary configuration of a touch sensing system during operation.

Before an actual frequency measurement, a receiver level at the second electrode E2 or the first and the second receiver node R1, R2, respectively may be calibrated or balanced to a normalized signal transmission. To this end, a switching configuration according to FIG. 2 can be set for the touch sensing system, wherein switches S1, S3, S4 are closed and the remaining switches S2, S5, S6, S7 are open. During this switching configuration, the signal generator Tx is turned on such that an AC signal is provided by the signal generator at the first transmitter node T1. The signal receiver Rx may then be controlled such that a possible leakage over the open switch S5 is balanced to generate a zero output or a predetermined low output at the output of the signal receiver Rx. This increases the accuracy of the frequency measurement.

Figure 3:
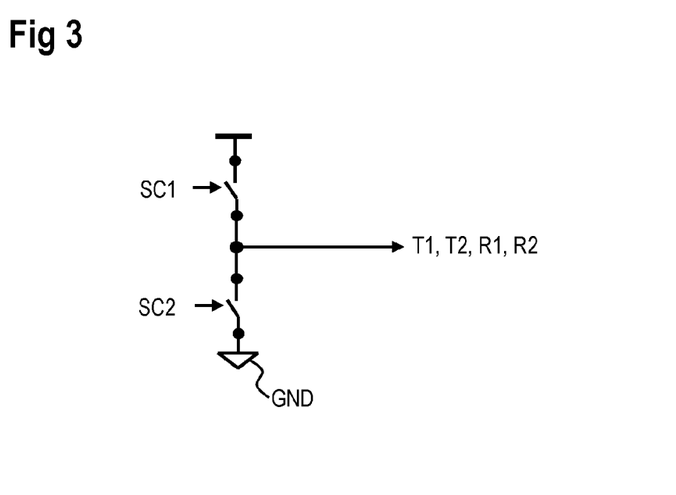
FIG. 3 shows an exemplary detail of a capacitance measurement circuit.

Another method of detecting a change in capacitance of the capacitances Csr, Cst in order to detect the presence of a sense object is to directly measure capacitance values at the transmitter node T1, T2 and/or the receiver nodes R1, R2. The capacitance measurement can be performed in various ways, one of which is shown as an example in FIG. 3. Two switches SC1, SC2 are connected in series between a supply potential terminal and the reference potential terminal GND, wherein a connecting point of the switches SC1, SC2 is connected to the respective node whose capacitance is to be measured. The switches SC1, SC2 for example can operate in three states namely close, open and current source. For example the switch SC2 can be used to discharge the respective capacitance to the reference potential at the respective measurement node. The switch SC1 can be used to connect the measurement node to a current source providing a reference current in order to charge the capacitance from a first threshold value to a second threshold value. A counter may be used, which starts, when the voltage at the measurement node reaches or exceeds the first predetermined threshold value and is stopped, when the voltage at the measurement node reaches or exceeds the second predetermined threshold value. The resulting counter value can be used as a measured value of capacitance of the respective measurement node. Alternatively, the counter value can be used to map the capacitance value to a different domain, e.g. by recalculating the capacitance value in a different unit from the measured counter value. In some embodiments, the switches SC1, SC2 can be used to transmit a periodic AC signal for the transmission method described before.

Figure 4:
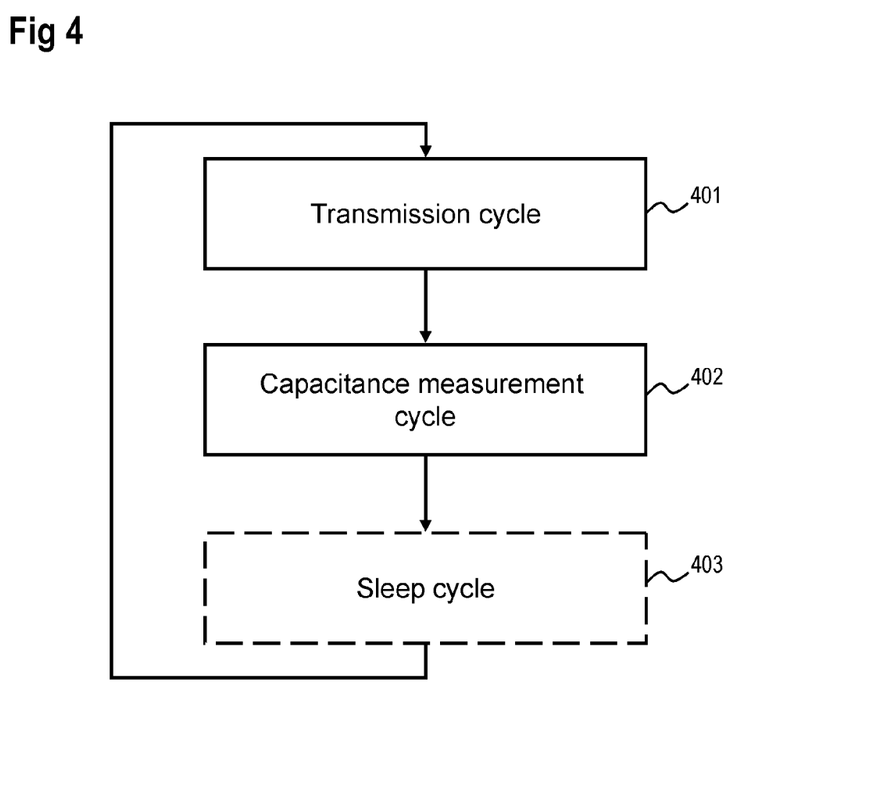
FIG. 4 shows a block diagram of an embodiment of a method for operating a touch sensing system.

The described methods for detecting a change in capacitance may be combined for the detection of a sense object and further for the calibration of the touch sensing system. FIG. 4 shows an exemplary block diagram of such a combined method, which starts with a block 401 denoting a transmission cycle. During such transmission cycle, the AC signal is transmitted from the transmitter electrode E1 to the receiver electrode E2 and the detection, whether a sense object is present at the electrodes E1, E2 is based on the received signal, as described before.

The following block 402 denotes a capacitance measurement cycle. During the capacitance measurement cycle, different capacitance values at the nodes T1, T2, R1, R2 are measured and used for either calibration of the touch sensing system or detection of a sense object or both.

In a following block 403 a sleep cycle may be performed, during which no measurement or detection is performed in order to save power. However, the sleep cycle can also be omitted, if desired, such that a next transmission cycle immediately follows.

The capacitance values to be measured depend on the presence of a sense object at the first and the second electrode E1, E2. In particular, a differentiation can be made between three basic cases. In case A, no sense object is present at the electrodes E1, E2. In case B, a sense object is present at the electrodes E1, E2 but is not connected to the reference potential terminal GND. Hence, the sense object has no common ground with the touch sensing system. In case C, a sense object is also present at the first and the second electrode E1, E2 but is grounded, i.e. has a connection to the reference potential terminal of the touch sensing system. This situation of case C may for example be present if the touch sensing system is included in a device which is connected to an AC power plug, for example by a charger, and the sense object, for example a human body, is in contact with the ground terminal of this AC supply.

The three cases have different implications on the measurement of capacitance values at the nodes T1, T2, R1, R2. With respect to these three cases, FIG. 5 shows switching configurations of the touch sensing system for case A, FIG. 6 shows switching configurations for case B and FIG. 7 shows switching configurations for case C.

Figure 5A:
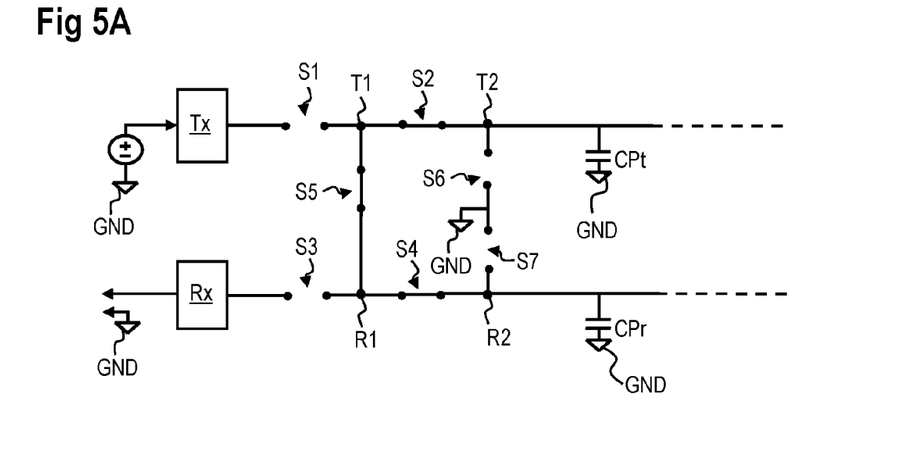
FIG. 5 shows further configurations of a touch sensing system.

In the configuration of FIG. 5A, switches S2, S4 and S5 are closed while switches S1, S3, S6, S7 are open. Hence, the transmitter nodes T1, T2 and the receiver nodes R1, R2 are commonly connected to both the first and the second electrode E1, E2, which are not shown here for a better overview. The nodes T1, T2, R1, R2 are separated from the signal generator Tx and the signal receiver Rx, respectively. As no sense object is present for this case A, the touch sensing system is electrically open at the electrode side, denoted by the dashed line.

For example, the switching configuration of FIG. 5A is set in a first measuring period in order to measure a first capacitance value at at least one of the nodes T1, T2, R1, R2. By such measurement, a capacitance between the respective measuring node and the reference potential terminal GND can be measured in order to determine a first capacitance value Ctot. If a measurement is performed at more than one node in the same switching configuration, an average can be build from the different measurements. For example, a first measurement is performed at the first transmitter node T1 and a second measurement is performed at the first receiver node R1.

Figure 5B:
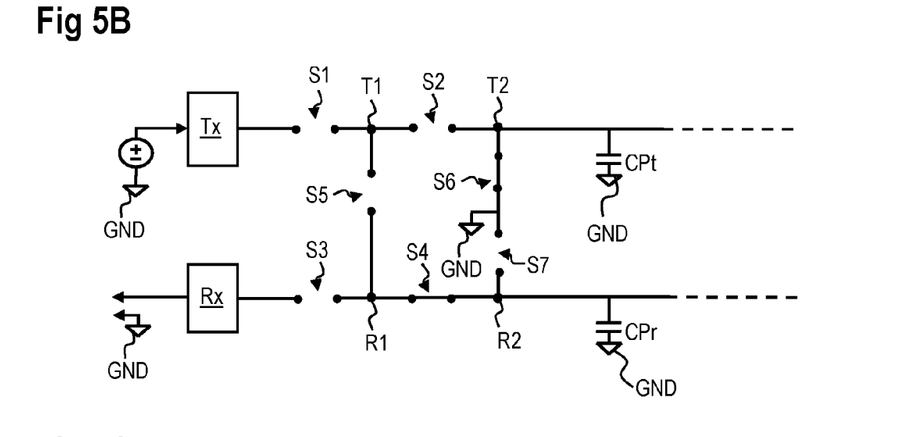

FIG. 5B shows a switching configuration for a second measuring period, during which a second capacitance value Crm at at least one of the first receiver node R1 and the second receiver node R2 is measured. To this end, the first and the second receiver node R1, R2 are connected together and to the receiver electrode E2 by means of the closed switch S4. Furthermore, the transmitter electrode E1 is grounded by switch S6, which connects the second transmitter node T2 to the reference potential terminal GND. The remaining switches S1, S2, S3, S5 are held open if the capacitance measurement of the second capacitance value Crm is performed at both the first and the second receiver node R1, R2, averaging can be performed as described before.

Figure 5C:
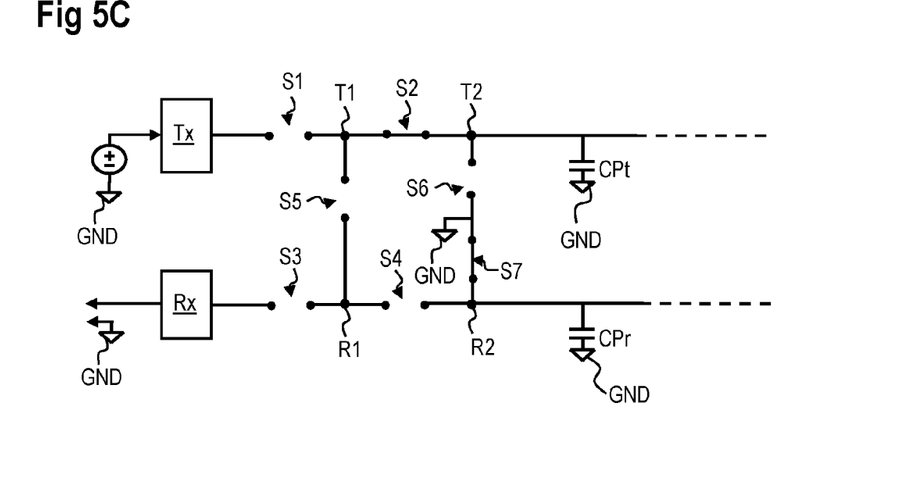

FIG. 5C shows a third switching configuration for a third measuring period, which is similar to the switching configuration of FIG. 5B but intended for use of capacitance measurement at the transmitter side. To this end, the first and the second transmitter node T1, T2 are connected to the transmitter electrode E1 by closed switch S2. Receiver electrode E2 is connected to the ground potential terminal by closed switch S7. Switches S1, S3, S4, S5 are open. This switching configuration is used in a third measuring period, during which a third capacitance value Ctm is measured at at least one of the first transmitter node T1 and the second transmitter node T2. In particular, a capacitance to the reference potential terminal GND is measured. The measured capacitance values Ctot, Crm and Ctm can be used as reference values for calibration of the touch sensing system. In particular, as in case A, no sense object is present at the electrodes E1, E2, the measured capacitance values can directly be taken as a total reference value CTOT, a receiver reference value CR and a transmitter reference value CT such that $CTOT=Ctot$, $CR=Crm$, and $CT=Ctm$.

FIG. 6 shows various switching configurations for case B, if a sense object is present but not grounded. Hence, with reference to FIG. 1, serially connected capacitances Cst, Csr result between the first and the second electrode E1, E2 or between the second transmitter node T2 and the second receiver node R2, respectively.

Figure 6A:
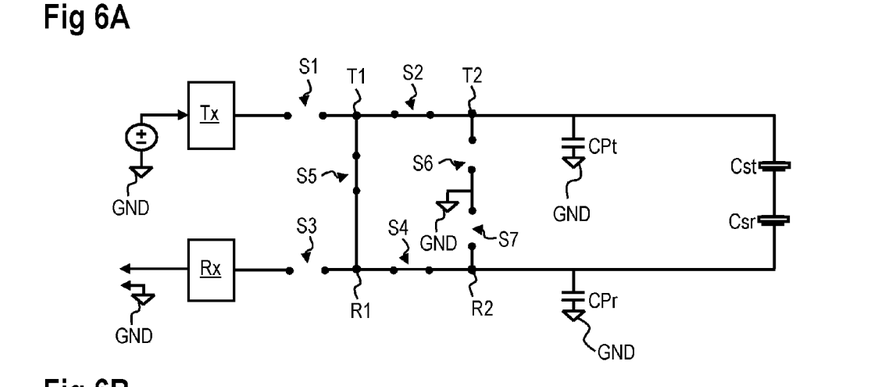
FIG. 6 shows further configurations of a touch sensing system.

A switching configuration of the touch sensing system in FIG. 6A is the same as in FIG. 5A. Furthermore, the same measurement is performed as in FIG. 5A in a first measuring period, resulting in a first capacitance value Ctot. However, as the receiver side and the transmitter side are connected together by switch S5, the series connection of the capacitances Cst, Csr of the sense object are bridged or shorted, such that the influence of the sense object on the measurement during the first measuring period is eliminated. The measured first capacitance value Ctot can be used for further processing.

Figure 6B:
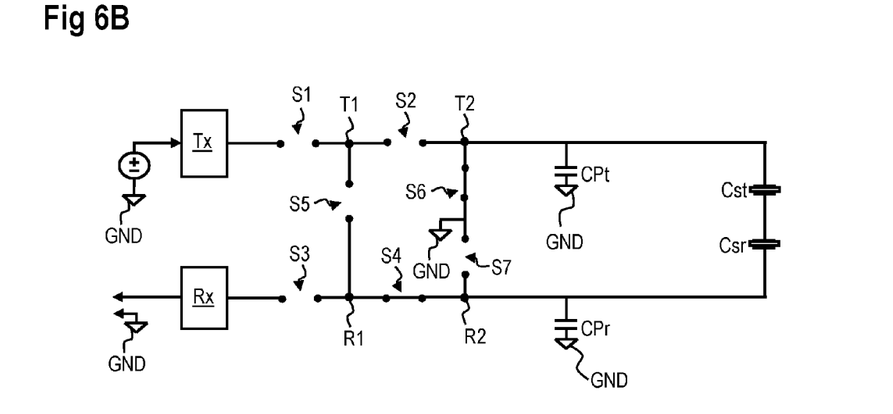

The switching configuration of FIG. 6B is the same as in FIG. 5B. Hence, in a similar fashion as described for FIG. 5B, a second capacitance value Crm is measured during a second measuring period having this switching configuration, wherein the capacitances Cst, Csr influence the measurement, compared to the measurement of FIG. 5B.

Figure 6C:
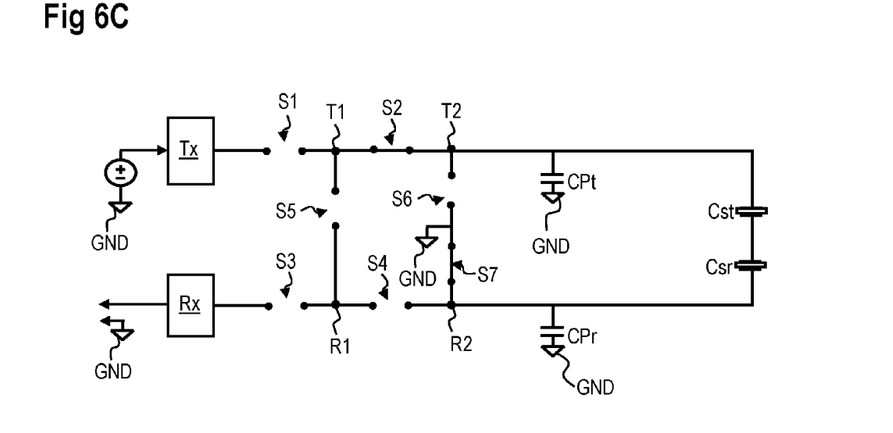

In a similar fashion, a switching configuration of FIG. 6c is the same as in FIG. 5c for measuring a third capacitance value Ctm in a third measuring period. Although this measurement is influenced by the presence of the sense object, namely the existence of capacitances Cst, Csr due to the three measurements, the actual reference values without the influence of the sense object can be calculated from the measured capacitance values.

Let Cs be the combined capacitance of the capacitances Cst, Csr, which are connected in series, such that $$Cs = \frac{Csr \cdot Cst}{Csr + Cst}.$$

With a total reference value CTOT, a receiver reference value CR and a transmitter reference value CT, it can be seen from FIG. 6a that $Ctot=CR+CT$ In a similar way, it can be seen from FIG. 6b that $Crm=CR+Cs$, and from FIG. 6c, that $Ctm=CT+Cs$.

Therefore, $Crm+Ctm=Ctot+2 \cdot Cs$, and $Cs=[(Crm+Ctm)-Ctot]/2$.

Hence, it can be deduced from the above formulas that $CTOT=Ctot$, $CR=(Crm-Ctm+Ctot)/2$, and $CT=(Ctm-Crm+Ctot)/2$, which can be used to update the total reference value CTOT, the receiver reference value CR and the transmitter reference value CT.

Figure 7A:
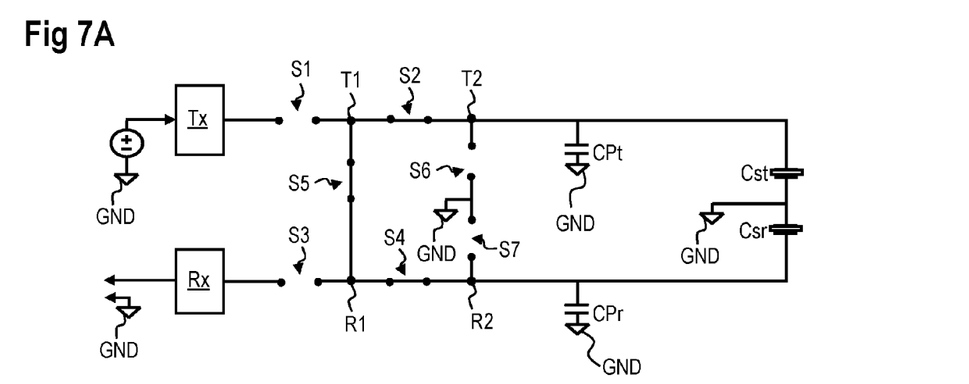
FIG. 7 shows further configurations of a touch sensing system.
Figure 7B:
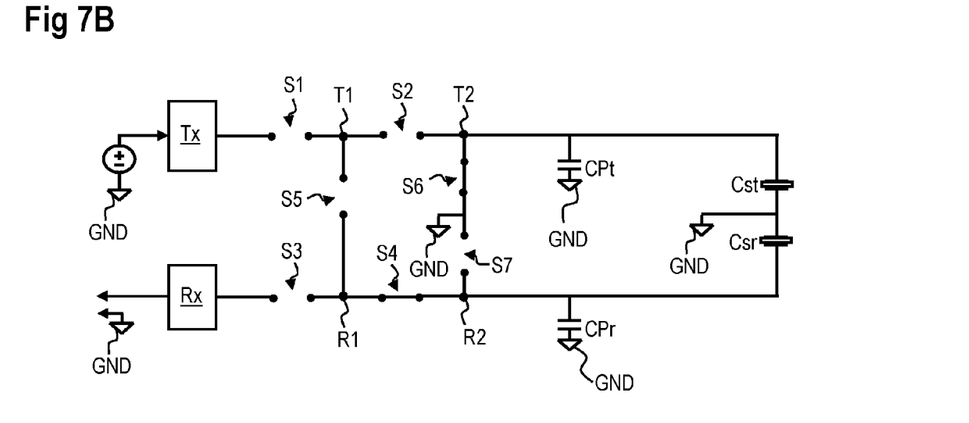
Figure 7C:
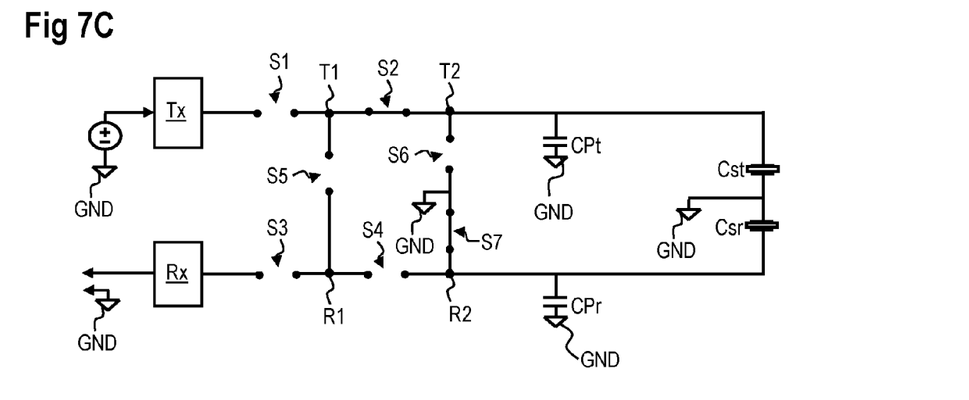

FIG. 7 shows various switching configurations for case C, in which a sense object is present and connected to the reference potential terminal GND. With reference to FIG. 5 and FIG. 6, corresponding switching configurations are used in FIG. 7A, FIG. 7B and FIG. 7C, respectively. Hence, a respective capacitance value can be measured in each of the three measuring periods or switching configurations, respectively. However, due to the ground connection of the sense object, the influence of the resulting capacitances Cst, Csr is not eliminated in any of the switching configurations. In particular, for the measurement in FIG. 7A, the capacitances Cst, Csr will add to the capacitances being there without the sense object being present.

Referring to FIG. 7B, a measurement of the receiver capacitance at receiver nodes R1 and/or R2 will be influenced by the capacitance Csr while the capacitance Cst is grounded. In a similar fashion, with reference to FIG. 7C a capacitance measurement at the transmitter nodes T1 and/or T2 is influenced by the capacitance Cst, whereas the capacitance Csr is grounded.

As a consequence, in case C, a change of capacitance may be detected during the capacitance measurement, which indicates the presence of a sense object. As the influence of the resulting capacitances Csr, Cst cannot be calculated out, an updating of stored reference values CTOT, CR, CT is not possible. However, case C usually is a rare case, in particular if the touch sensing system is used in a mobile device which has no connection to a common ground with the user of the mobile device.

As indicated before, the knowledge of the three cases can be used to detect a sense object and to perform a calibration of reference values, in particular in combination with the transmission measurement described before.

Figure 8:
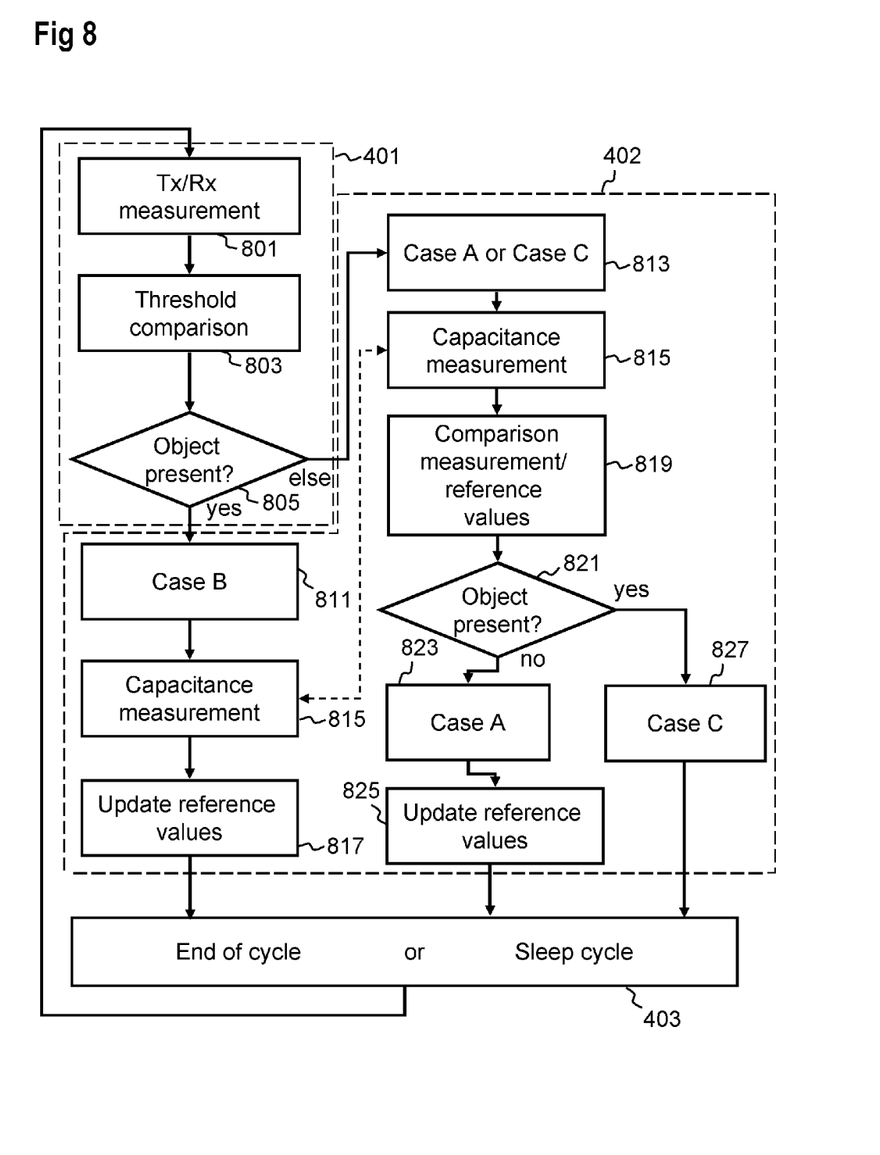
FIG. 8 shows a further block diagram of an embodiment of a method for operating a touch sensing system.

FIG. 8 shows a more detailed block diagram of a method for operating a touch sensing system, based on the block diagram of FIG. 4. In block 801, a transmitter/receiver measurement is performed in order to determine a receiver level in response to an AC signal provided by the signal generator Tx.

In block 803 a threshold comparison is performed based on the signal level at the signal receiver Rx. In particular, the received signal level is compared to a reference level which depends on the calibration of the touch sensing system, as described before. If the difference between the received signal and the reference level is greater than the threshold, the presence of a sense object can be detected. In this case, it is continued with block 811 which denotes the previously described case B of a sense object being present but having no common ground connection to the touch sensing system. If the presence of an object cannot be determined in block 805, it is continued with block 813 denoting that either case A or case C may be present. Blocks 801, 803 and 805 correspond to the transmission cycle 401.

In all three cases A, B, C, a capacitance measurement is performed in block 815. In particular, the capacitance measurement includes the first measuring period, the second measuring period and the third measuring period, as described before in conjunction with FIG. 5, FIG. 6 and FIG. 7.

If case B is present, the reference values can be updated in block 817 according to the calculations described in conjunction with FIG. 6. Hence, in case B, both the detection of the object being present and the calibration of the touch sensing system can be performed. After updating the reference values in block 817, the cycle can be ended or a sleep cycle can be performed in block 403. After that, the method can be repeated by starting again at the transmission cycle 401.

If a sense object was not detected to be present in block 805, both case A or case C are possible cases. After the capacitance measurement in block 815, the measured capacitance values Ctot, Crm, Ctm can be compared to the stored reference values in order to detect whether a sense object is present or not in blocks 819, 821. For example, a difference between measured capacitance values Ctot, Crm, Ctm and the reference values CTOT, CR, CT is calculated in block 819. One or more of the respective differences is respectively compared to respective threshold which is indicative for a sense object being present.

If the thresholds are not crossed, it is continued with block 823 denoting case A such that it is assumed that no sense object is present at the electrodes of the touch sensing system. Hence, in block 825, the measured capacitance value can be used to update the reference values, as described before in conjunction with FIG. 5.

If the threshold comparison in block 821 determines that a sense object is present, it is continued with block 827, denoting case C. Hence, only the presence of the sense object can be detected, while calibrating of the touch sensing system is omitted in this case. However, the capacitance measurement makes it possible to detect the presence of the sense object, which could not be detected with the transmission method in block 401.

In both case A and case C, it is continued with an end of cycle or sleep cycle 403, as described before for case B.

With reference to case C, the comparison of the measured capacitance values Ctot, Crm, Ctm with the reference values CTOT, CR, CT is able to detect whether the values of the measured capacitances exceeds the stored reference values. Furthermore, this comparison makes it possible to retrieve information on how much the value of each capacitance exceeds the stored values. If a proper threshold is chosen to keep a measurement tolerance, an accurate detection can be achieved to detect a sense object.

With reference to the various embodiments described above, it should be noted that since the reference values of capacitances CR, CT and CTOT are continuously updated in case A and case B, such that the touch sensing system can track environment changes regularly. Hence, accuracy of detection is improved. It should be further noted that the capacitance measurement cycle 402 is able to perform both calibration and detection. In particular, the touch sensing system can be calibrated even if a sense object is present. This provides a more continuous calibration.

The invention claimed is:

1. Touch sensing system, comprising a signal generator (Tx), which is configured to provide an AC signal; a signal receiver (Rx), which is configured to perform a signal detection; a first transmitter node (T1), which is connected to the signal generator (Tx) in a switchable fashion; a second transmitter node (T2), which is connected to the first transmitter node (T1) in a switchable fashion and to a reference potential terminal (GND) in a switchable fashion; a first receiver node (R1), which is connected to the signal receiver (Rx) in a switchable fashion and to the first transmitter node (T1) in a switchable fashion; a second receiver node (R2), which is connected to the first receiver node (R1) in a switchable fashion and to the reference potential terminal (GND) in a switchable fashion; a first electrode (E1), which is connected to the second transmitter node (T2); a second electrode (E2), which is connected to the second receiver node (R2); and a capacitance measurement circuit (CMC), which is coupled to the first transmitter node (T1) and/or the second transmitter node (T2), coupled to the first receiver node (R1) and/or the second receiver node (R2), and configured to measure respective capacitance values at the first transmitter node (T1) or the second transmitter node (T2) and at the first receiver node (R1) or the second receiver node (R2).

2. Touch sensing system according to claim 1, wherein the first transmitter node (T1) is connected to the signal generator (Tx) by means of a first switch (S1); the second transmitter node (T2) is connected to the first transmitter node (T1) by means of a second switch (S2); the first receiver node (R1) is connected to the signal receiver (Rx) by means of a third switch (S3); the second receiver node (R2) is connected to the first receiver node (R1) by means of a fourth switch (S4); the first receiver node (R1) is connected to the first transmitter node (T1) by means of a fifth switch (S5); the second transmitter node (T2) is connected to the reference potential terminal (GND) by means of a sixth switch (S6); the second receiver node (R2) is connected to the reference potential terminal (GND) by means of a seventh switch (S7); the first electrode (E1) is directly connected to the second transmitter node (T2); and the second electrode (E2) is directly connected to the second receiver node (R2).

3. Touch sensing system according to claim 1 or 2, wherein the touch sensing system is configured to detect, whether a sense object (OBJ) is present at the first electrode (E1) and the second electrode (E2), based on the signal detection of the signal receiver (Rx) in response to an AC signal provided by the signal generator (Tx).

4. Touch sensing system according to claim 3, wherein the touch sensing system is configured to measure, in a first measuring period, a first capacitance value (Ctot) at at least one of the first transmitter node (T1), the second transmitter node (T2), the first receiver node (R1) and the second receiver node (R2), with the respective node (T1, T2, R1, R2) being electrically connected to both the first electrode (E1) and the second electrode (E2); to measure, in a second measuring period, a second capacitance value (Crm) at at least one of the first receiver node (R1) and the second receiver node (R2), with the respective node (R1, R2) being electrically connected to the second electrode (E2), and with the first electrode (E1) being electrically connected to the reference potential terminal (GND); and to measure, in a third measuring period, a third capacitance value (Ctm) at at least one of the first transmitter node (T1) and the second transmitter node (T2), with the respective node (T1, T2) being electrically connected to the first electrode (E1), and with the second electrode (E2) being electrically connected to the reference potential terminal (GND).

5. Touch sensing system according to claim 4, wherein the touch sensing system is configured, if a sense object (OBJ) was detected to be present, to determine a total capacitance value on the basis of the first capacitance value (Ctot); to update a stored total reference value (CTOT) with the total capacitance value; to determine a receiver capacitance value on the basis of the first capacitance value, the second capacitance value and the third capacitance value (Ctot, Crm, Ctm); to update a stored receiver reference value (CR) with the receiver capacitance value; to determine a transmitter capacitance value on the basis of the first capacitance value, the second capacitance value and the third capacitance value (Ctot, Crm, Ctm); and to update a stored transmitter reference value (CT) with the transmitter capacitance value.

6. Touch sensing system according to claim 5, wherein the touch sensing system is configured, if a sense object (OBJ) was detected to be present, to take the first capacitance value (Ctot) as the total capacitance value; to calculate the receiver capacitance value according to (Crm−Ctm+Ctot)/2; and to calculate the transmitter capacitance value according to (Ctm−Crm+Ctot)/2; wherein Ctot is the first capacitance value, Crm is the second capacitance value (Crm) and Ctm is the third capacitance value (Ctm).

7. Touch sensing system according to one of claim 4, wherein the touch sensing system is configured, if a sense object (OBJ) was not detected to be present, to perform a comparison of at least one of the following: the first capacitance value (Ctot) with a stored total reference value (CTOT), the second capacitance value (Crm) with a stored receiver reference value (CR), the third capacitance value (Ctm) with a stored transmitter reference value (CT); to determine, whether a sense object (OBJ) is present, on the basis of the comparison; and if a sense object (OBJ) is determined not to be present, to update the total reference value (CTOT) with the first capacitance value (Ctot), to update the receiver reference value (CR) with the second capacitance value (Crm), and to update the transmitter reference value (CT) with the third capacitance value (Ctm).

8. Touch sensing system according to claim 7, wherein the comparison of the respective capacitance values comprises to determine, whether a difference between the respective capacitance values exceeds a respective threshold.

9. Touch sensing system according to claim 4, wherein the touch sensing system is configured, if a respective capacitance value is measured at more than one respective node, to perform averaging over the respective measured capacitance values.

10. Touch sensing system according to one of claim 1, wherein the capacitance measurement circuit (CMC) is configured to measure a respective capacitance value by providing a reference current to the respective node (T1, T2, R1, R2), at which the capacitance value is to be measured; measuring a voltage at the respective node; determining a time period, during which the measured voltage changes from a first predefined value to a second predefined value; and determining the respective capacitance value on the basis of the determined time period.

11. Method for operating a touch sensing system, which comprises a first transmitter node (T1), a second transmitter node (T2), a first receiver node (R1), a second receiver node (R2), a first electrode (E1) and a second electrode (E2), the method comprising:

measuring, in a first measuring period, a first capacitance value (Ctot) at at least one of the first transmitter node (T1), the second transmitter node (T2), the first receiver node (R1) and the second receiver node (R2), with the respective node (T1, T2, R1, R2) being electrically connected to both the first electrode (E1) and the second electrode (E2);

measuring, in a second measuring period, a second capacitance value (Crm) at at least one of the first receiver node (R1) and the second receiver node (R2), with the respective node (R1, R2) being electrically connected to the second electrode (E2), and with the first electrode (E1) being electrically connected to a reference potential terminal (GND);

measuring, in a third measuring period, a third capacitance value (Ctm) at at least one of the first transmitter node (T1) and the second transmitter node (T2), with the respective node (T1, T2) being electrically connected to the first electrode (E1), and with the second electrode (E2) being electrically connected to the reference potential terminal (GND);

providing an AC signal to the first electrode (E1);

measuring a signal at the second electrode (E2) in response to the AC signal provided to the first electrode (E1); and detecting, whether a sense object (OBJ) is present at the first electrode (E1) and the second electrode (E2), based on the measured signal.

12. Method according to claim 11, wherein in the touch sensing system the second transmitter node (T2) is connected to the first transmitter node (T1) by means of a second switch (S2); the second receiver node (R2) is connected to the first receiver node (R1) by means of a fourth switch (S4); the first receiver node (R1) is connected to the first transmitter node (T1) by means of a fifth switch (S5); the second transmitter node (T2) is connected to a reference potential terminal (GND) by means of a sixth switch (S6); the second receiver node (R2) is connected to the reference potential terminal (GND) by means of a seventh switch (S7); the first electrode (E1) is directly connected to the second transmitter node (T2); and the second electrode (E2) is directly connected to the second receiver node (R2).

13. Method according to claim 12, wherein in the first measuring period the second switch (S2), the fourth switch (S4) and the fifth switch (S5) are closed while the sixth switch (S6) and the seventh switch (S7) are open; in the second measuring period the fourth switch (S4) and the sixth switch (S6) are closed while the second switch (S2), the fifth switch (S5) and the seventh switch (S7) are open; and in the third measuring period the second switch (S2) and the seventh switch (S7) are closed while the fourth switch (S4), the fifth switch (S5) and the sixth switch (S6) are open.

14. Method according to claim 11, further comprising, if a sense object (OBJ) was detected to be present, determining a total capacitance value on the basis of the first capacitance value (Ctot); updating a stored total reference value (CTOT) with the total capacitance value; determining a receiver capacitance value on the basis of the first capacitance value, the second capacitance value and the third capacitance value (Ctot, Crm, Ctm); updating a stored receiver reference value (CR) with the receiver capacitance value; determining a transmitter capacitance value on the basis of the first capacitance value, the second capacitance value and the third capacitance value (Ctot, Crm, Ctm); and updating a stored transmitter reference value (CT) with the transmitter capacitance value.

15. Method according to claim 14, further comprising, if a sense object (OBJ) was detected to be present, taking the first capacitance value (Ctot) as the total capacitance value; calculating the receiver capacitance value according to (Crm−Ctm+Ctot)/2; and calculating the transmitter capacitance value according to (Ctm−Crm+Ctot)/2; wherein Ctot is the first capacitance value, Crm is the second capacitance value (Crm) and Ctm is the third capacitance value (Ctm).

16. Method according to claim 11, further comprising, if a sense object (OBJ) was not detected to be present, performing a comparison of at least one of the following: the first capacitance value (Ctot) with a stored total reference value (CTOT), the second capacitance value (Crm) with a stored receiver reference value (CR), the third capacitance value (Ctm) with a stored transmitter reference value (CT); determining, whether a sense object (OBJ) is present, on the basis of the comparison; and if a sense object (OBJ) is determined not to be present, updating the total reference value (CTOT) with the first capacitance value (Ctot), updating the receiver reference value (CR) with the second capacitance value (Crm), and updating the transmitter reference value (CT) with the third capacitance value (Ctm).

17. Mobile device with a housing and with a touch sensing system according to claim 1, wherein the first electrode (E1) and the second electrode (E2) are arranged in or on the housing.

* * * * *